United States Patent
Kasanyal et al.

(10) Patent No.: US 9,705,490 B2
(45) Date of Patent: Jul. 11, 2017

(54) DRIVER CIRCUIT FOR SINGLE WIRE PROTOCOL SLAVE UNIT

(71) Applicant: NXP B.V., Eindhoven (NL)

(72) Inventors: Sunil Kasanyal, Pithoragarh (IN); Kiran Gopal, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/043,481

(22) Filed: Feb. 12, 2016

(65) Prior Publication Data
US 2016/0241233 A1    Aug. 18, 2016

(30) Foreign Application Priority Data
Feb. 13, 2015 (EP) .................... 15155043

(51) Int. Cl.
H03K 3/00   (2006.01)
H03F 3/04   (2006.01)
H03K 17/687 (2006.01)
H03K 19/0185 (2006.01)

(52) U.S. Cl.
CPC ....... *H03K 17/687* (2013.01); *H03K 19/0185* (2013.01)

(58) Field of Classification Search
CPC .................... H03K 17/687; H03K 19/0185
USPC ........................................... 330/288
See application file for complete search history.

(56) References Cited

U.S. PATENT DOCUMENTS

| 6,163,206 A * | 12/2000 | Kobayashi | G05F 3/205 327/143 |
| 6,281,730 B1 * | 8/2001 | Vu | H03K 19/00384 323/316 |
| 6,633,136 B2 * | 10/2003 | Kim | G09G 3/3611 315/169.3 |
| 6,998,904 B2 * | 2/2006 | Marshall | H03K 17/163 327/543 |

(Continued)

OTHER PUBLICATIONS

Mirvakili, A. et al. "A Digitally-controlled, Bi-level CMOS LED Driver Circuit Combining PWM Dimming and Data Transmission for Visible Light Networks", IEEE Globecom 2010 Workshop on Optical Wireless Communications, pp. 1067-1071 (Dec. 2010).

(Continued)

*Primary Examiner* — Kenneth B Wells (57) ABSTRACT

There is described a driver circuit for a single wire protocol slave unit, the driver circuit comprising (a) at least one current mirror comprising a first transistor (MP1, MN3) and a second transistor (MP2, MN4), wherein the gate of both transistors is connected to a bias node (PBIAS, S2BIAS), and wherein the second transistor is adapted to conduct a mirror current (I2, IOUT) equal to a current (I1, I2) conducted by the first transistor multiplied by a predetermined factor, (b) a bias transistor (MP3, MN5) for selectively connecting and disconnecting the bias node to and from a predetermined potential (VDD, GND) in response to a control signal (ABUF, AN), and (c) a current boosting element for providing a boost current (I1P, I2P) to the bias node for a predetermined period of time when the control signal causes the bias transistor to disconnect the bias node from the predetermined potential. There is also described a universal integrated circuit card device comprising a driver circuit.

7 Claims, 8 Drawing Sheets

(56) References Cited

U.S. PATENT DOCUMENTS

| | | | | |
|---|---|---|---|---|
| 7,064,696 B2 * | 6/2006 | Ohkubo | ........... | H03M 1/745 |
| | | | | 323/312 |
| 7,414,457 B2 * | 8/2008 | Ogawa | ........... | G05F 3/205 |
| | | | | 327/538 |
| 7,518,435 B2 * | 4/2009 | Kim | ........... | H04W 52/028 |
| | | | | 327/538 |
| 8,305,122 B2 * | 11/2012 | Sakaguchi | ........... | H01S 5/06808 |
| | | | | 327/108 |
| 8,487,692 B1 | 7/2013 | Chen et al. | | |
| 8,519,694 B2 * | 8/2013 | Berkhout | ........... | G05F 3/262 |
| | | | | 323/315 |
| 8,531,236 B2 * | 9/2013 | Lechner | ........... | G05F 3/262 |
| | | | | 327/543 |
| 8,610,422 B2 * | 12/2013 | Figueiredo | ........... | H03M 1/002 |
| | | | | 323/315 |
| 8,670,710 B2 | 3/2014 | Miles | | |
| 9,405,308 B2 * | 8/2016 | Lintonen | ........... | G05F 1/468 |
| 2007/0205810 A1 | 9/2007 | Rees et al. | | |
| 2008/0094111 A1 | 4/2008 | Nakamori et al. | | |

OTHER PUBLICATIONS

Extended European Search Report for Patent Appln. No. 15155043.1 (Sep. 4, 2015).

\* cited by examiner

Fig. 1

(PRIOR ART)

Fig. 2

(PRIOR ART)

Fig. 3

(PRIOR ART)

DRIVER CIRCUIT FOR SINGLE WIRE PROTOCOL SLAVE UNIT

CROSS-REFERENCE TO RELATED APPLICATIONS

This application claims the priority under 35 U.S.C. §119 of European patent application no. 15155043.1, filed on Feb. 13, 2015, the contents of which are incorporated by reference herein.

FIELD OF THE INVENTION

The present invention relates to the field of Single Wire Protocol (SWP) communication, in particular to driver circuits for SWP slave units and to Universal Integrated Circuit Card (UICC) devices comprising such driver circuits.

ART BACKGROUND

Single Wire Protocol (SWP) is a communication link between united integrated circuit card (UICC) and near field communication (NFC) devices where the NFC device acts as master and the UICC as slave. The slave provides communication signals to the master in the form of current.

Existing driver circuits for UICC slave devices suffer from difficulties in meeting the timing requirements of the SWP protocol while at the same time keeping power consumption down.

There may thus be a need for an improved slave driver circuit which is capable of safely meeting the SWP timing requirements with minimum power consumption.

SUMMARY OF THE INVENTION

This need may be met by the subject matter according to the independent claims. Advantageous embodiments of the present invention are set forth in the dependent claims.

According to a first aspect of the invention, there is provided a driver circuit for a single wire protocol slave unit. The driver circuit comprises (a) at least one current mirror comprising a first transistor and a second transistor, wherein the gate of both transistors is connected to a bias node, and wherein the second transistor is adapted to conduct a mirror current equal to a current conducted by the first transistor multiplied by a predetermined factor, (b) a bias transistor for selectively connecting and disconnecting the bias node to and from a predetermined potential in response to a control signal, and (c) a current boosting element for providing a boost current to the bias node for a predetermined period of time when the control signal causes the bias transistor to disconnect the bias node from the predetermined potential.

This aspect is based on the idea that the addition of a boost current will speed up the settling of the voltage at the bias node, which may have a significant node capacitance. As the boost current is only applied for a limited period of time, this increase can be obtained without a significant increase in power consumption.

In the present context, the term "providing a boost current to the bias node" may particularly denote supplying boost current to the bias node, in which case the current boosting element may be seen as a current generator, or drawing boost current from the bias node, in which case the current boosting element may be seen as a current sink.

When the bias node is connected to the predetermined potential, none of the first and second transistors are conducting. When the bias node is then disconnected from the predetermined potential, the voltage at the bias node will go through a period of settlement until it eventually settles at a value that allows the first and second transistors to conduct. The length of this period is determined by the capacitance of the bias node and the available current. By adding the boost current at the beginning of the settling, the period can be shortened significantly. Thereby, the mirror current in the second transistor will rapidly reach its steady state value.

Both the first and second transistors are preferably either NMOS or PMOS transistors. In this case, the width of the second transistor equals the width of the first transistor multiplied by the predetermined factor.

According to an embodiment, the driver circuit further comprises a boost control circuit for generating a boost control signal based on the control signal.

The boost control signal is preferably a binary signal that may have one value indicating that the current boosting element is to provide the boost current and another value indicating that the current boosting element shall not provide any boost current.

The boost control signal is used to control the current boosting element such that the latter begins providing the boost current substantially synchronously with the control signal and stops providing the boost current after the predetermined period of time.

According to a further embodiment, the boost control circuit comprises a delay element adapted to provide a delay to the control signal, the delay corresponding to the predetermined period of time.

By applying a suitable logic operation, such as NAND, to the control signal and the delayed control signal, the boost control circuit can generate a boost control signal indicating that the boost current is to be supplied from a certain value of the control signal and until the predetermined period of time, corresponding to the delay, has passed.

According to a further embodiment, the current boosting element comprises a boost transistor connected to the bias node and adapted to conduct the boost current in response to the boost control signal.

Accordingly, this embodiment relies on a transistor as a current generator or current sink for supplying or drawing the boost current to or from the bias node.

According to a further embodiment, the driver circuit further comprises (a) a further current mirror coupled in cascade with the current mirror, the further current mirror comprising a third transistor and a fourth transistor, wherein the gate of both transistors is connected to a further bias node, and wherein the fourth transistor is adapted to conduct a mirror current equal to a current conducted by the third transistor multiplied by a further predetermined factor, (b) a further bias transistor for selectively connecting and disconnecting the further bias node to and from a further predetermined potential in response to the control signal, and (c) a further current boosting element for providing a further boost current to the further bias node for the predetermined period of time when the control signal causes the further bias transistor to disconnect the bias node from the further predetermined potential.

The further current mirror, further bias transistor and further current boosting element are functioning in a manner similar to the functioning of the current mirror, bias transistor and current boosting element as described above. That is, the further elements of this embodiment are similar or even identical to the corresponding elements described above. In some cases, the further transistors may be of the opposite type than the above described transistors, e.g. if the first transistor, second transistor and bias transistor are all PMOS transistors, the third transistor, fourth transistor and further bias transistor may all be NMOS transistors, and vice versa.

The current mirrors are coupled in cascade in the sense that the mirrored current of one of the current mirrors (i.e. the current in the second or fourth transistor) corresponds to the current that is being mirrored in the other current mirror (i.e. the current in the third or first transistor). Thereby, an even larger current multiplication can be obtained.

According to a further embodiment, the further current boosting element comprises a further boost transistor connected to the further bias node and adapted to conduct the further boost current in response to the boost control signal.

This embodiment provides an implementation of the further current boosting element that is similar to the one described above with regard to the current boosting element. Again, the further boost transistor may be the opposite type of the boost transistor.

According to a further embodiment, the driver circuit further comprises a yet further current mirror coupled in cascade with the current mirror and the further current mirror, the yet further current mirror comprising a fifth transistor and a sixth transistor, wherein the gate of the fifth transistor is connected to the gate of the sixth transistor, and wherein the sixth transistor is adapted to conduct a mirror current equal to a reference current conducted by and provided to the fifth transistor multiplied by a yet further predetermined factor.

In this embodiment, the driver circuit comprises a total of three cascaded current mirrors, two of which also comprises a boost transistor and a current boosting element. The yet further current mirror provides a mirrored current corresponding to a reference current multiplied by a yet further predetermined factor. The two addition current mirrors (with boost circuits) multiply this mirrored current even further, such that at the end, the reference current is multiplied by the product of the predetermined factor, the further predetermined factor and the yet further predetermined factor.

According to a further embodiment, the boosting element comprises a first boost transistor and a second boost transistor, wherein the first and second boost transistors are connected in series between the bias node and the further predetermined potential, wherein the gate of the first boost transistor is coupled to receive the boost control signal, and wherein the gate of the second boost transistor is coupled to the interconnected gates of the fifth and sixth transistors of the yet further current mirror. Furthermore, the further boosting element comprises a third boost transistor and a fourth boost transistor, wherein the third and fourth boost transistors are connected in series between the further bias node and the predetermined potential, wherein the gate of the third boost transistor is coupled to receive the boost control signal, and wherein the gate of the fourth boost transistor is coupled to the interconnected gates of the first and second transistors of the current mirror.

In other words, both the boosting element and the further boosting element comprise two boost transistors, one acting as a switch to turn the boosting current on and off in response to the boost control signal and the other one acting as the actual boost current generator or sink.

According to a second aspect, there is provided a universal integrated circuit card device comprising a driver circuit according to the first aspect or any of the above embodiments.

This aspect provides a UICC device that is capable of complying with the timing requirements of SWP at very low power consumption. Thus, the device is highly suitable for mobile devices and other devices with limited power resources.

It should be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless otherwise indicated, in addition to any combination of features belonging to one type of subject matter also any combination of features relating to different subject matters, in particular a combination of features of the method type claims and features of the apparatus type claims, is also disclosed with this document.

The aspects defined above and further aspects of the present invention will be apparent from the examples of embodiment to be described hereinafter and are explained with reference to the examples of embodiment. The invention will be described in more detail hereinafter with reference to examples of embodiment to which the invention is, however, not limited.

DETAILED DESCRIPTION

The illustration in the drawing is schematic. It is noted that in different figures, similar or identical elements are provided with the same reference signs or with reference signs, which differ only within the first digit.

Figure 1:
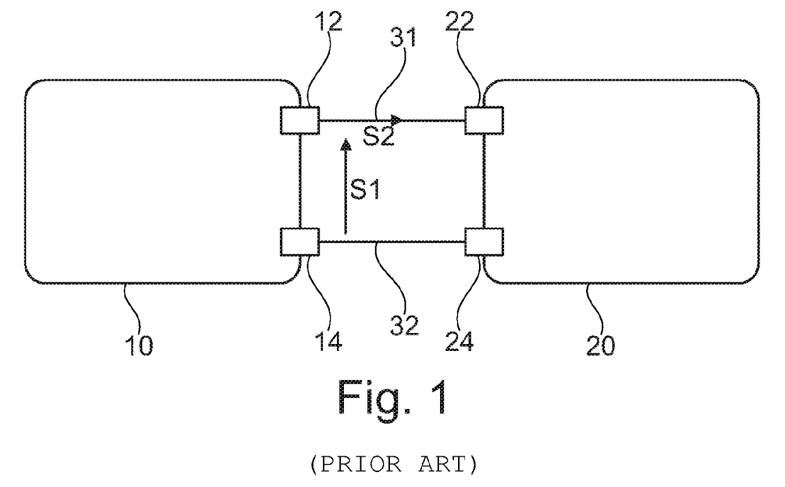
FIG. 1 shows a schematic view of SWP communication between a master and a slave.

FIG. 1 shows a schematic view of SWP communication between a master 10 and a slave 20. More specifically, the SWP interface is a bit oriented, point-to-point communication protocol between a Universal Integrated Circuit Card (UICC) 10 and a Contactless Frontend (CLF) or Near Field Communication (NFC) device 20 through connecting wires 31 and 32. The wire 31 connects signal (SWIO) terminal 12 of master 10 with signal terminal 22 of slave 20. Similarly, the wire 32 connects ground terminal (GND) 14 of master 10 with ground terminal 24 of slave 20. The signaling protocol is defined by the European Telecommunications Standards Institute (ETSI) in its document No. TS102613. The interface is also briefly explained in U.S. Pat. No. 8,670,710. According to the SWP signaling protocol, the CLF 10 is the master and the UICC 20 is the slave.

The principle of the Single Wire Protocol is based on the transmission of digital information in full duplex mode: The signal S1 (L or H) is transmitted by master 10 in the voltage domain. The signal S2 (L or H) is transmitted by slave 20 in the current domain.

A logic 'one' (or H) of the signal S1 is provided by a 0.75 duty cycle waveform, i.e. S1 is high for 0.75 of the waveform period. A logic 'zero' (or L) of the signal S1 is provided by a 0.25 duty cycle waveform, i.e. S1 is high for 0.25 of the waveform period.

The S2 signal is only valid when S1 is high. Logic 'one' (H) of the signal S2 is indicated by the slave drawing a current of between 600 uA to 1 mA. Logic 'zero' (L) of the signal S2 is indicated by the slave drawing a current of between 0 and 20 uA.

Figure 2:
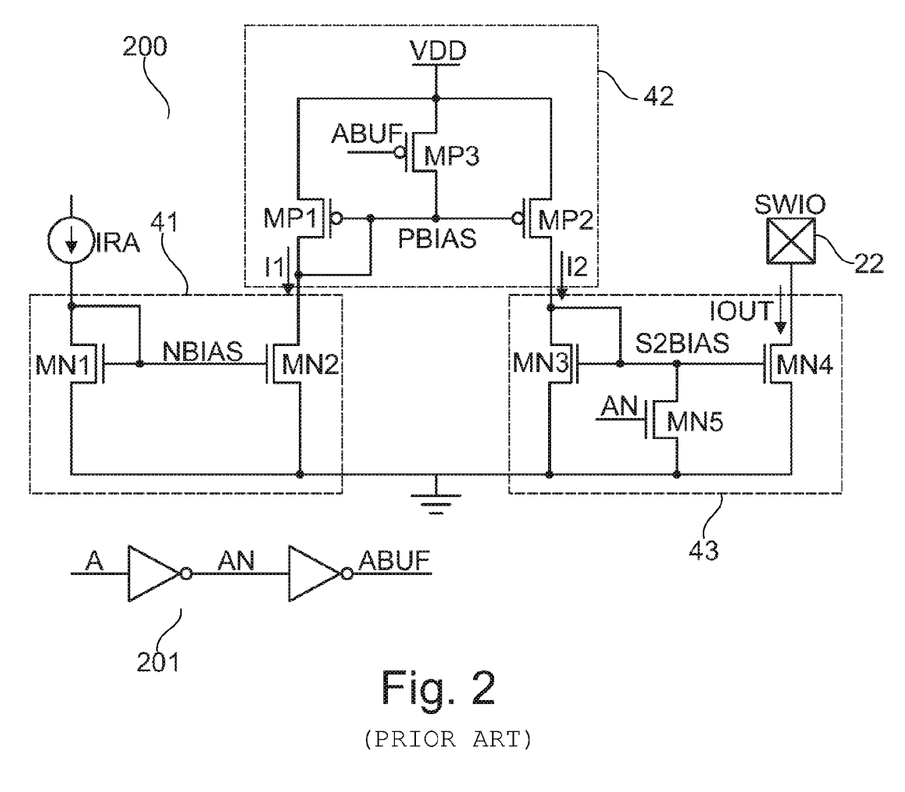
FIG. 2 shows a diagram of a conventional SWP slave driver circuit.

FIG. 2 shows a diagram of a conventional SWP slave driver circuit 200 with control circuit 201. The circuit 200 is constituted by three cascaded current mirror stages 41, 42 and 43. In this implementation, control signal 'A' is coming from a SWP controller which decides the logic level at the output of SWP slave driver 'SWIO' 22. IRA is a reference current, such as 1 uA, and VDD is the supply voltage. The intermediate signal 'AN' is created by inverting input signal 'A' and signal 'ABUF' is created by buffering the input signal 'A'. When 'A' is 'low', the output of SWP driver 'SWIO' 22 will be logic 'low' and the driver 200 does not sink current. This is achieved by turning off NMOS transistor MN4. When 'A' is 'high', output of the driver will be logic 'high' and the driver is able to sink a current having a value from 600 uA to 1 mA. This is achieved by properly biasing the NMOS MN4.

To get the current sink as output driver, there is a requirement of a reference current either from bandgap or from any other current reference circuit. In the circuit implementation of FIG. 2, IRA is the reference current of 1 uA. To get the required current at the final output 22 of the driver 200, this current needs to be multiplied by 800 times to get an 800 uA output current, which is the typical value of SWP slave output current IOUT. The transistors MN1 and MN2 form the first stage current mirror 41, MP1 and MP2 form the second stage 42, and MN3 and MN4 form the third stage 43. The latter is connected to the output SWIO 22. The transistors are sized in such a way that they provide an overall multiplication of 800 between MN1 and MN4. In one implementation, the first stage 41 and second stage 42 can have multiplication factors of 10 with respect to their previous stage and the third stage 43 can have a multiplication factor of 8, i.e. I1=10×IRA, I2=10×I1, IOUT=8× I2=800×IRA. The multiplication factors are preferably obtained by designing the transistors such that their widths fulfill the following: WMN2=10×WMN1, WMP2=10× WMP1, WMN4=8×WMN3. The multiplication factors between stages should be chosen in such a way as to provide symmetry in layout and also to reduce static power dissipation in each stage. The operation of the conventional driver circuit 200 shown in FIG. 2 is explained below:

Low Current at SWIO 22: When A=L, the transistor MP3 is ON, bias node PBIAS is charged to VDD, MP1 and MP2 are OFF, I1=10×IRA, I2=0 μA. Further, the transistor MN5 is ON, bias node S2BIAS is discharged to ground, MN3 and MN4 are OFF, and the output current IOUT=0 μA.

High Current at SWIO 22: When A=H, the transistor MP3 is OFF, bias node PBIAS settles to a bias voltage to provide current I1 through MP1 which is equal to the current of MN2. The current I1 is mirrored to MP2 by the chosen multiplication factor which generates current I2. The bias node S2BIAS settles to a value so that MN3 provides current I2. I2 is mirrored to the final stage of driver MN4 which generates output current IOUT.

Figure 3:
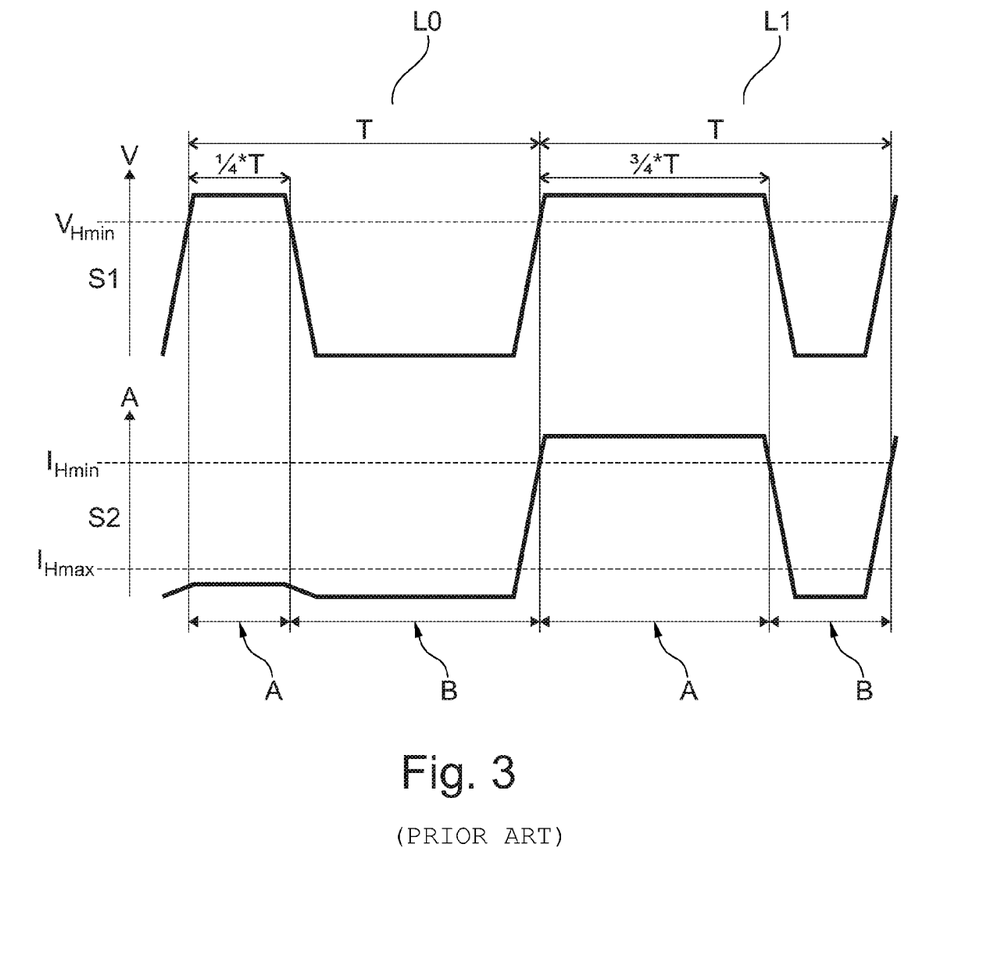
FIG. 3 shows timing and bit coding of SWP communication signals.

FIG. 3 shows timing and bit coding of SWP communication signals S2 and S1. As mentioned above, the nominal duration of the state high for a '1' is 75% (range is 70% to 80%) of bit duration T and the nominal duration of the state high for a '0' is 25% (range is 20% to 30%) of T. According to ETSI standard 'ETSI TS 102 613 V9.1.0', the minimum bit duration T is 590 ns. The S2 signal is valid only when S1 is high. The slave (UICC) 20 shall only perform switching of S2 when S1 is in state low.

During SWP interfacing, when S1 signal transition happens from high to low, the falling edge of S1 acts as clock and activates slave controller to provide data on S2 line. S2 data on SWIO line 22 must be available before S1 goes from low to high. Assume a worst case when S1 data is logic high. In this case S1 remains at high voltage for 80% of the bit duration and then falls to zero. S1 will remain at zero voltage for 20% of bit duration T, which will be 0.2×590=118 ns. It means that within 118 ns, the falling edge of S1 should propagate through SWP slave receiver 20, do required processing in slave controller and final data should be transferred through SWP slave transmitter to SWIO line 22. Hence, the transmitter delay from 'A' to 'SWIO' is a crucial parameter for SWP timing along with the delay of SWP slave receiver and SWP slave controller. The present invention aims at improving (i.e. reducing) the delay of SWP slave driver 200.

Returning to FIG. 2, it is noted that during logic 'zero' transmission, MP1 and MP2 are turned off in order to reduce the static power consumption. However, when a 'zero' to 'one' transition is happening at input 'A', the bias nodes PBIAS and S2BIAS start settling to the required voltage levels. Due to the low current (to reduce power dissipation) and large node capacitances (due to larger devices to meet analog performance) associated with these nodes, signal ramping to its final value slows down and hence the transmission delay from 'A' to 'SWIO' increases and possibly violates the timing budget allocated for S2 evaluation. Increasing the static current to speed-up the ramping of PBIAS and S2BIAS is an option, but at the cost of higher power dissipation which is not encouraged for circuits used in mobile applications.

Figure 4A:
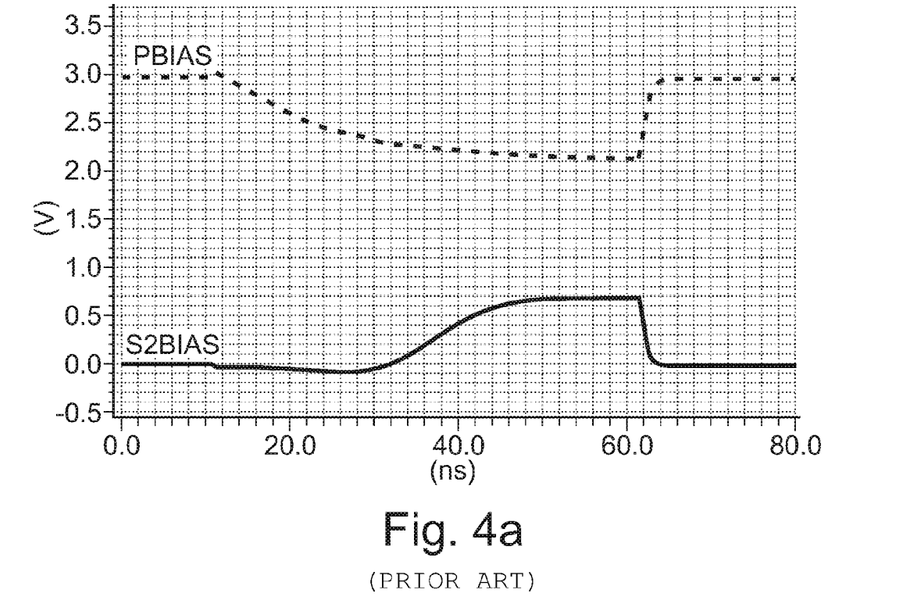
FIG. 4A shows plots of the bias voltages in the circuit of FIG. 2.

To illustrate the above, FIG. 4A shows plots of the bias voltages at PBIAS and S2BIAS in the circuit 200 of FIG. 2, when 'A' switches from '0' to '1'. These plots are obtained as simulation results for a nominal process, 25° C. temperature, 3V supply voltage (VDD) and 100 ps transition time for signal 'A'. The plotted waveforms show that after A changes state from '0' to '1', PBIAS and S2BIAS take significant amounts of time to reach their respective steady state value. As can be seen, the approximate time taken by PBIAS and S2BIAS to reach the steady state value is around 40 ns after 'A' switches from '0' to '1'.

Figure 4B:
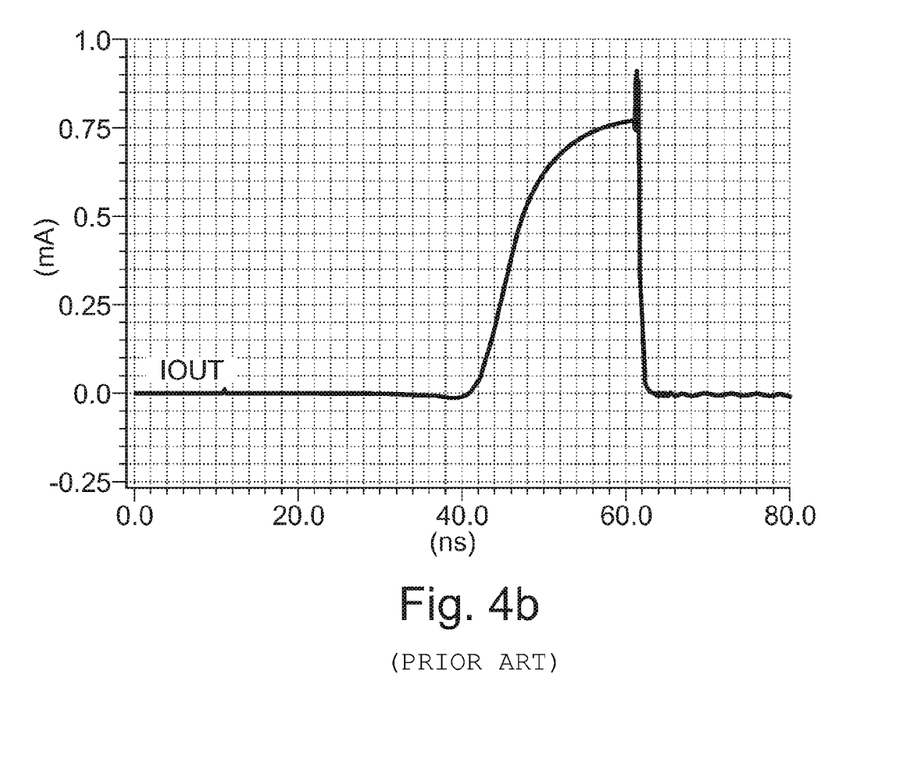
FIG. 4B shows a plot of the output current in the circuit of FIG. 2.

Furthermore, FIG. 4B shows a plot of the output current IOUT in the circuit 200 of FIG. 2. As shown, IOUT reaches a stabilized high level (600 uA) after approximately 40 ns delay. Thus, higher 'A' to 'SWIO' delay reduces the timing margin of the SWP protocol and hence the data loss. This delay will be further worsened (i.e. increased) in slower process, voltage and temperature conditions, thus leading to a further worsening of the problem.

Figure 5:
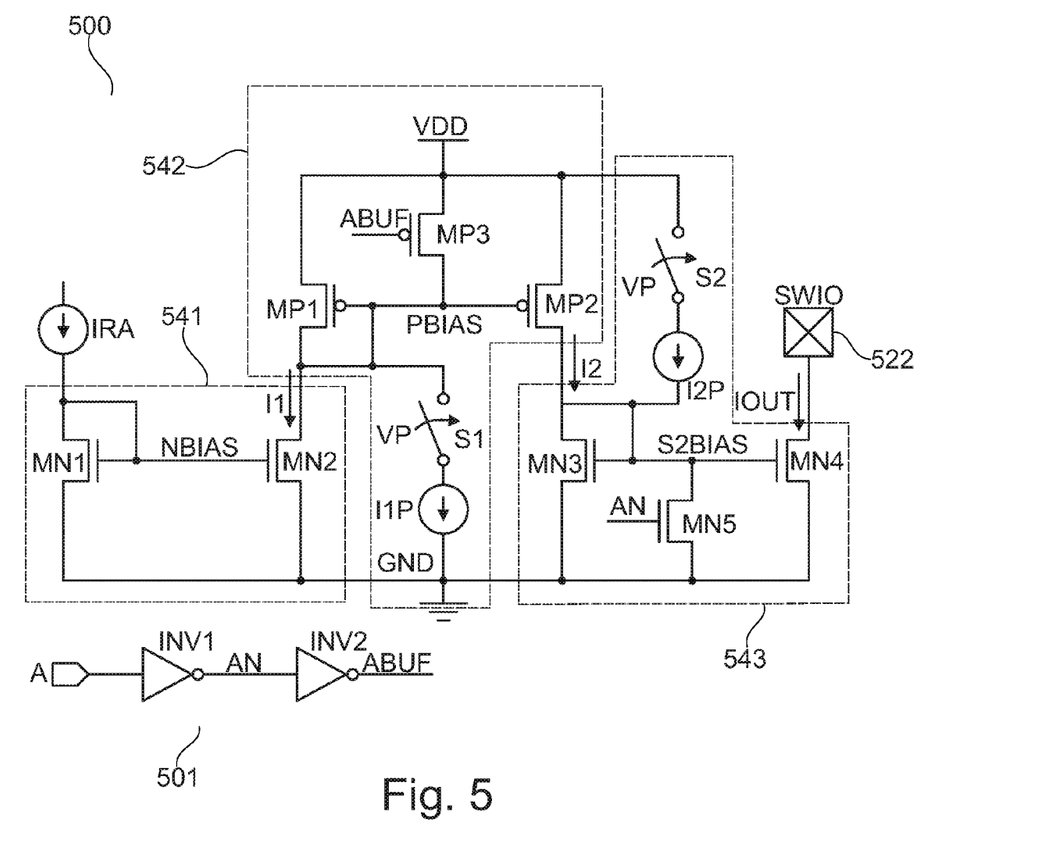
FIG. 5 shows a principal diagram of a SWP slave driver circuit in accordance with the present invention.

FIG. 5 shows a principal diagram of a SWP slave driver circuit 500 in accordance with the present invention. As will be described in the following, the present invention relies on dynamic boosting. As can be seen, the main circuit of SWP Slave driver 500 remains similar to the conventional driver 200 as shown in FIG. 2. As described earlier, the signal 'A' is coming from SWP controller which decides the logic level at the output of SWP slave driver 'SWIO' 522. IRA is the reference current, VDD is the supply voltage. Intermediate signal 'AN' is created by inverting input signal 'A' and signal 'ABUF' is created by buffering the input signal 'A'. When 'A' is 'low', the output of SWP driver 'SWIO' 522 will be logic 'low' and the driver 500 sinks no current. This is achieved by turning off NMOS MN4. When 'A' is 'high', the output of the driver 500 will be logic 'high' and the driver 500 is able to sink a current having a value from 600 uA to 1 mA. This is achieved by properly biasing the NMOS MN4.

As can be seen in FIG. 5, in comparison to the conventional driver 200 of FIG. 2, a current sink I1P is added at node PBIAS through a switch S1 and a current source I2P is added node S2BIAS through a switch S2. The switches S1 and S2 are controlled by boost control signal VP. This signal VP is a pulse signal which is generated for a certain amount of time when signal 'A' goes from '0' to '1'.

When control signal 'A' goes high from the low state, ABUF goes high and turns off PMOS MP3 and the voltage at node PBIAS starts falling to its steady state value. Also, with the transition of 'A', the control signal VP pulse is generated, causing the switch S1 to close and thereby connect current sink I1P to PBIAS. This additional current sink I1P speeds up the falling of the voltage at PBIAS and thereby the settling at its steady state value. Since the boost control signal VP signal goes low/off after a certain amount of time, the voltage at PBIAS will settle to its required steady state value and will not get affected by I1P. Similarly, when 'A' goes high and the boost control signal VP is generated, switch S2 is closed and thereby adds additional current source I2P to node S2BIAS. This similarly speeds up the rising of the voltage at S2BIAS to its steady state value. Since the boost control signal VP goes low/off after a certain amount of time, the voltage at S2BIAS will settle to its steady state value without getting affected by I2P.

Figure 6:
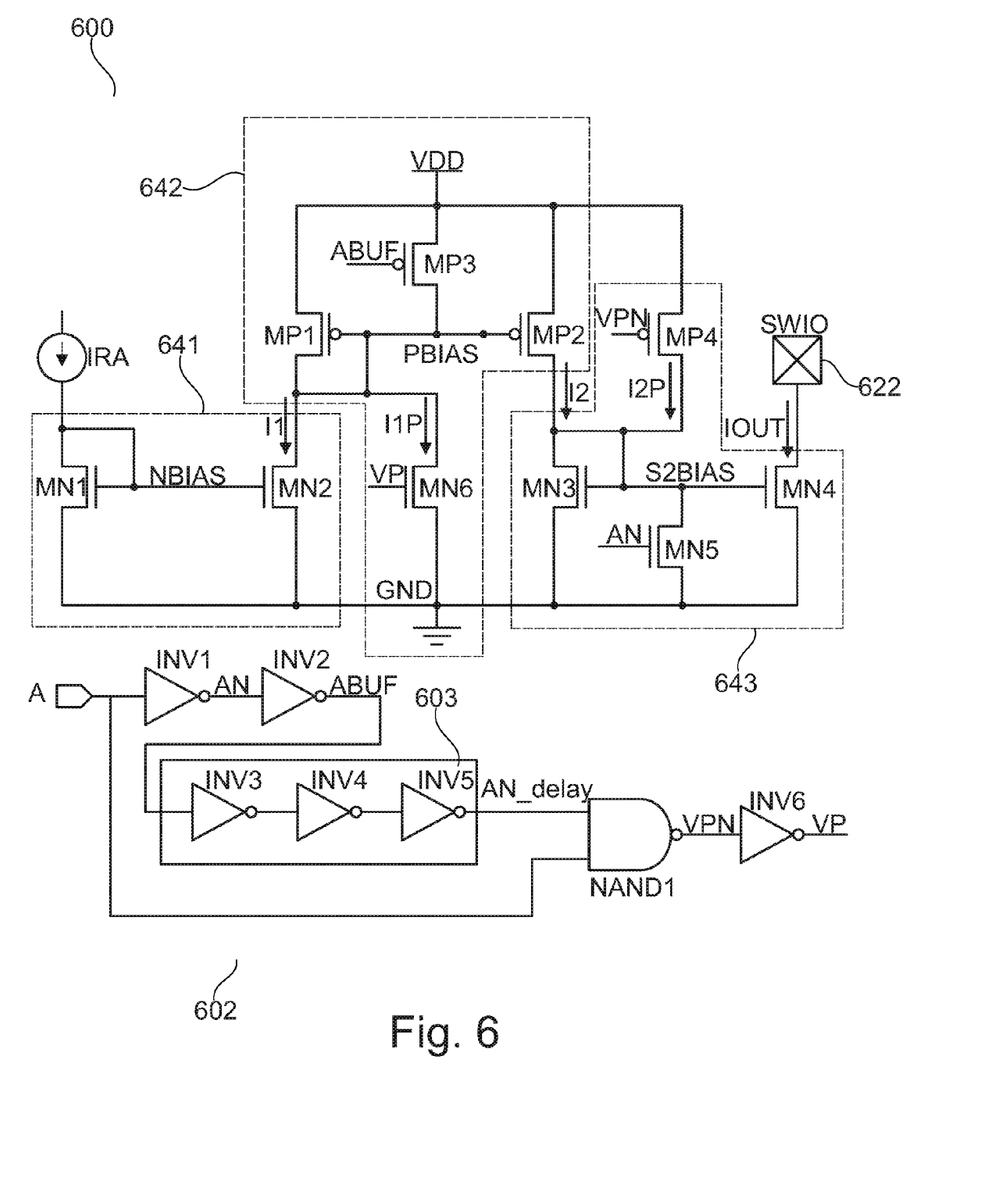
FIG. 6 shows a diagram of a SWP slave driver circuit in accordance with an embodiment of the present invention.

FIG. 6 shows a diagram of a SWP slave driver circuit 600 in accordance with an embodiment of the present invention. More specifically, FIG. 6 shows one possible implementation for providing dynamic boosting in accordance with the principle shown in FIG. 5 and discussed above. More specifically, switch S1 and current sink I1P are implemented by an NMOS MN6, while switch S2 and current source I2P are implemented by a PMOS MP4. NMOS MN6 is controlled by the boost control pulse signal VP and PMOS MP4 is controlled by the inverted pulse signal VPN. A Circuit 602 for generating the boost control signal VP and VPN is also shown in FIG. 6. In order to generate the pulsed boost control signal, a NAND gate NAND1 is used. One input of NAND1 is the SWP slave input signal 'A' and another input to NAND1 is the delayed inverted signal of 'A' which is indicated as AN_delay. To generate the delayed signal AN_delay, an inverter chain 603 comprising an odd number of inverters INV3, INV4, INV5 is used. The inverter chain 603 is shown as comprising three inverters. However, it is emphasized that any odd number of inverters may be used. Furthermore, the inverter chain 603 may also be replaced by any other suitable delay circuit capable of generating an inverted signal. The output of NAND1 is the inverted boost control signal VPN which controls the gate of MP4. VPN is further inverted by INV6 to generate the non-inverted boost control signal VP which controls the gate of MN6.

When A is '0', one input of NAND1 is '0' and the other input AN_delay is '1' such that the output of NAND1 is '1' and, therefore, VPN is '1' and VP is '0', which makes transistors MP4 and MN6 off. When 'A' goes from '0' to '1', one input of NAND gate NAND1 goes to '1' while the second input AN_delay remains at '1', therefore the output of NAND1 goes from '1' to '0'. Hence VPN goes to '0' and VP goes to '1'. This event turns on MN6 and MP4. Turning on of MN6 drains additional current from the node PBIAS and hence speeds-up the discharging of this node. Similarly, VPN, which goes to '0', turns on MP4 and provides additional current to node S2BIAS to speed-up the corresponding charging. VPN remains at '0' until AN_delay goes to '0', which happens after the delay provided between input signal 'A' and AN_delay. Once signal AN_delay goes to '0', it brings VPN to '1' and VP to '0' and turns off MN6 and MP4. The delay between A and AN_delay is provided by having an odd number of inverters in inverter chain 603. Thus, the duration of the VP pulse is equal to the total delay of the inverter chain between 'A' and 'AN_delay'. The delay of this inverter chain can be adjusted in accordance with specific boosting requirements.

The delay chain 603 of inverters in FIG. 6 provides compensation across operating conditions. For fast operating conditions (process: fast, temperature: −40° C. and maximum supply voltage), when 'A' goes from '0' to '1', discharging of PBIAS and charging of S2BIAS will be faster and boosting is needed for a shorter period of time. In this operating condition, the delay of inverter chain 603 will be less and hence the width of the boost pulse VP (and VPN) will be correspondingly short. For slow operating conditions (process: slow, temperature: 125 C.°, minimum supply voltage), when 'A' goes from '0' to '1', discharging of PBIAS and charging of S2BIAS will be slower. In this operating condition, the delay of inverter chain 603 will be longer and hence the width of boost pulse VP (and VPN) will be larger. This shows that the given circuit implementation provides compensation for operating conditions so that circuit performance remains uniform. Since the boost pulse is generated for short duration only when 'A' has '0' to '1' transition, there is no additional static power consumption.

Figure 7A:
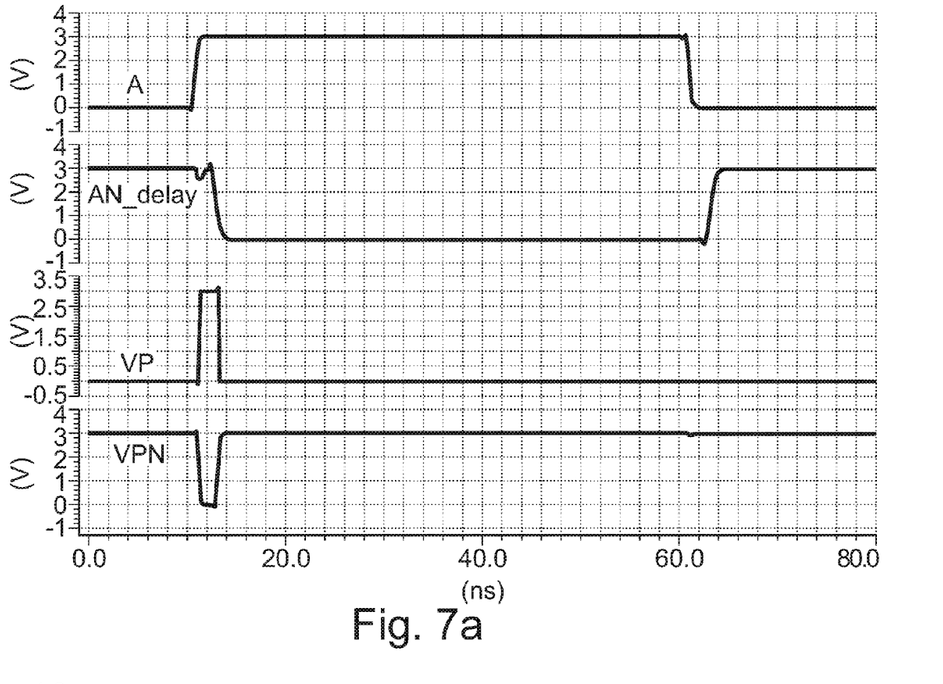
FIG. 7A shows plots of control signals and boost control signals in accordance with an embodiment of the present invention.

FIG. 7A shows plots of control signals A and boost control signals VP, VPN in accordance with the embodiment of the present invention shown in FIG. 6. More specifically, FIG. 7A shows the waveform of VP and VPN in the embodiment of the present invention shown in FIG. 6. When 'A' switches from '0' to '1', AN_delay goes from '1' to '0' after the delay provided by the inverter chain. VP goes from '0' to '1' and VPN goes from '1' to '0' along with 'A'. The duration of the pulse of VP and VPN is equal to the delay of the inverter chain 603.

Figure 7B:
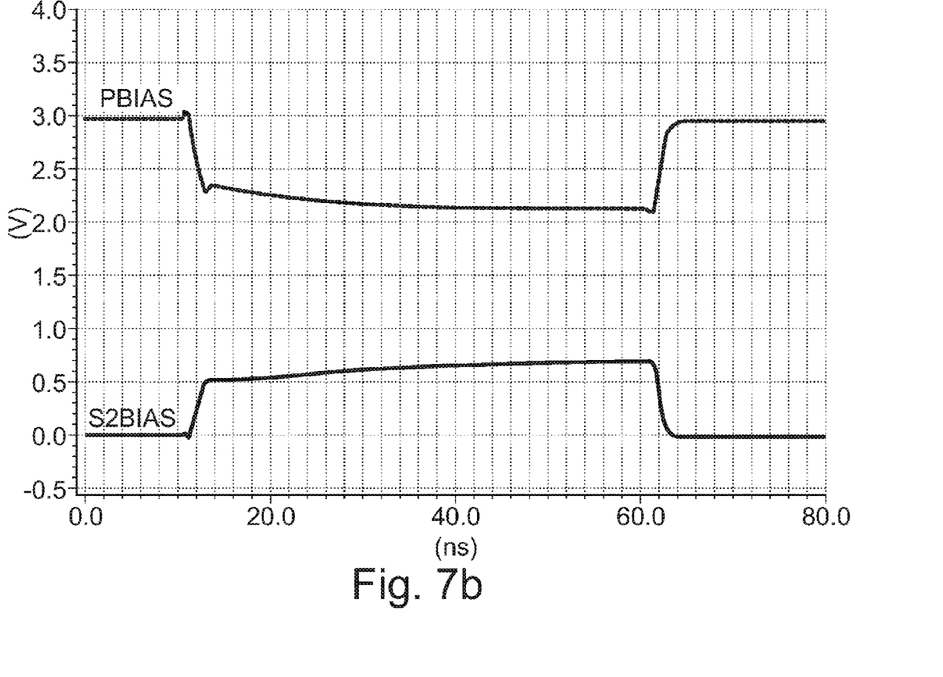
FIG. 7B shows plots of the bias voltages in the circuit of FIG. 6.

FIG. 7B shows plots of the bias voltages PBIAS and S2BIAS in the circuit of FIG. 6. As can be seen, these two bias voltages settle to their steady state values within 2 ns after 'A' changes from '0' to '1'. In comparison, the conventional driver 200 of FIG. 2 takes around 40 ns to settle these voltages (see FIG. 4A).

Figure 7C:
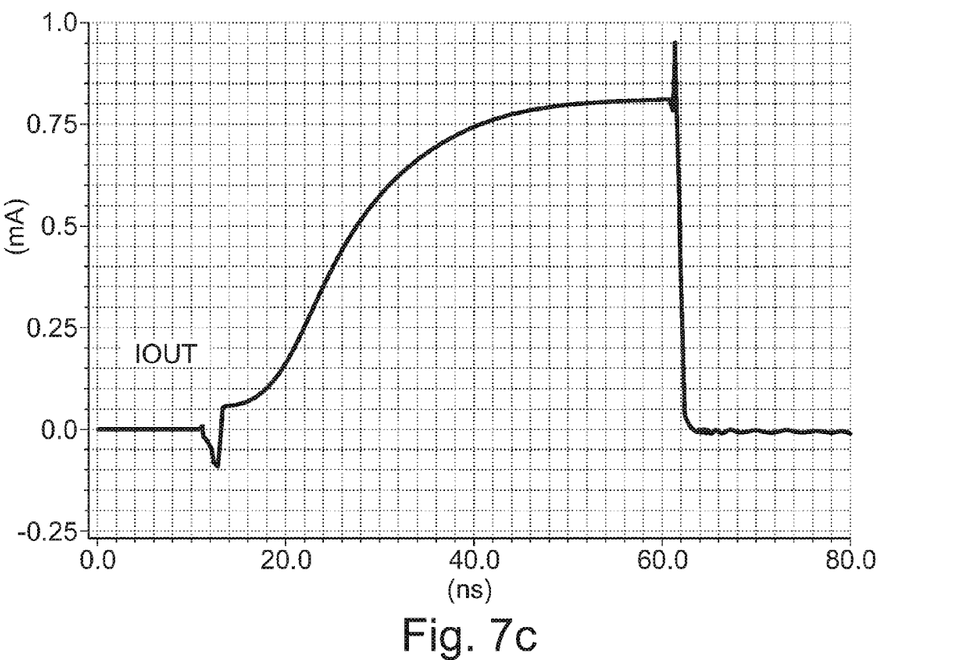
FIG. 7C shows a plot of the output current in the circuit of FIG. 6.

FIG. 7C shows a plot of the output current IOUT in the circuit of FIG. 6. As shown, IOUT settles to its high value within 18 ns after 'A' switches from '0' to '1'. As shown in FIG. 4B, the conventional SWP Slave driver output current IOUT takes 40 ns to settle after 'A' switches from '0' to '1'. This comparison clearly shows that the present invention improves the switching delay of SWP Slave driver 600. Thus, it will improve the total timing budget of the SWP interface.

Figure 7D:
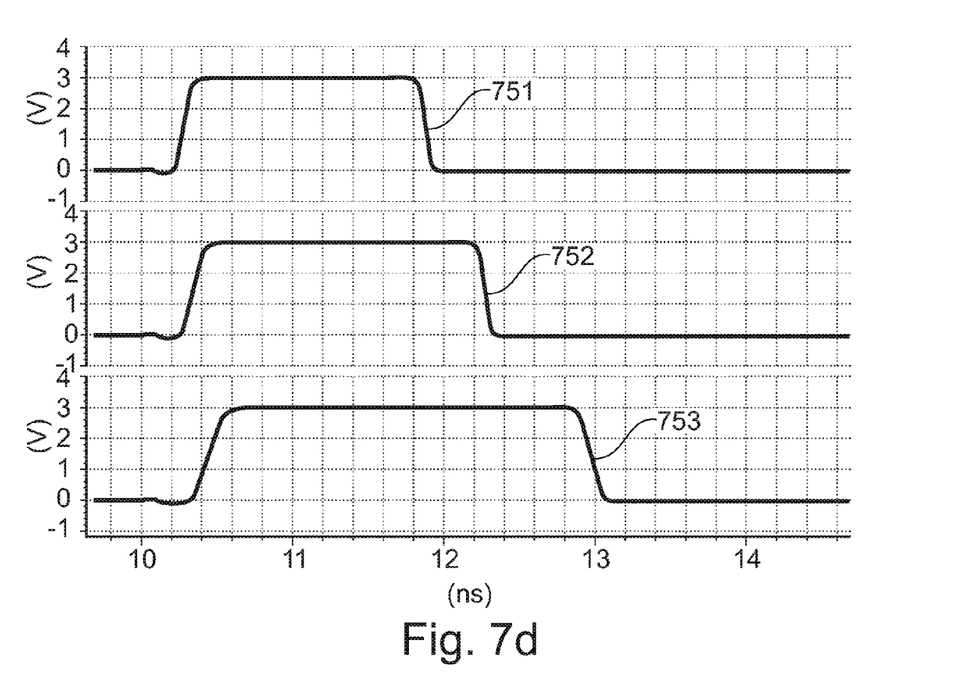
FIG. 7D shows plots of the boost control signal under various conditions.

FIG. 7D shows plots of the boost control signal under various conditions. More specifically, FIG. 7D shows the width of boost pulse VP at three different process corners at 25° C. temperature, 3V supply voltage and 100 ps transition time for signal 'A'. The upper waveform 751 is the pulse width for fast process corner where the pulse width is around 1.6 ns. The middle waveform 752 is for nominal process corner where the pulse width is around 1.9 ns. The lower waveform 753 is for slow process corner where the pulse width is around 2.5 ns. As explained before, at fast operating conditions, settling of PBIAS, S2BIAS and IOUT is faster so boosting is needed for a shorter period of time, whereas for slow operating condition settling of PBIAS, S2BIAS and IOUT is slower so boosting is needed for a longer period of time. The circuit of the present invention provides a boost pulse having a short duration for fast process corner whereas it is longer for slow process corner. Hence the circuit of the present invention provides compensation across process corner and in a broader sense it provides compensation across operating condition. This feature of the circuit provides almost uniform performance of the driver across operating conditions. As shown in FIG. 7B and FIG. 7D, the duration of the boost pulse VP is in the order of 2 ns only and the minimum bit duration for the SWP protocol is 590 ns. Hence, the present invention does not require any additional static current.

The simulation results in FIGS. 7A-7D are at nominal process, 25° C. temperature, 3V supply voltage and 100 ps transition time for signal 'A'.

Figure 8:
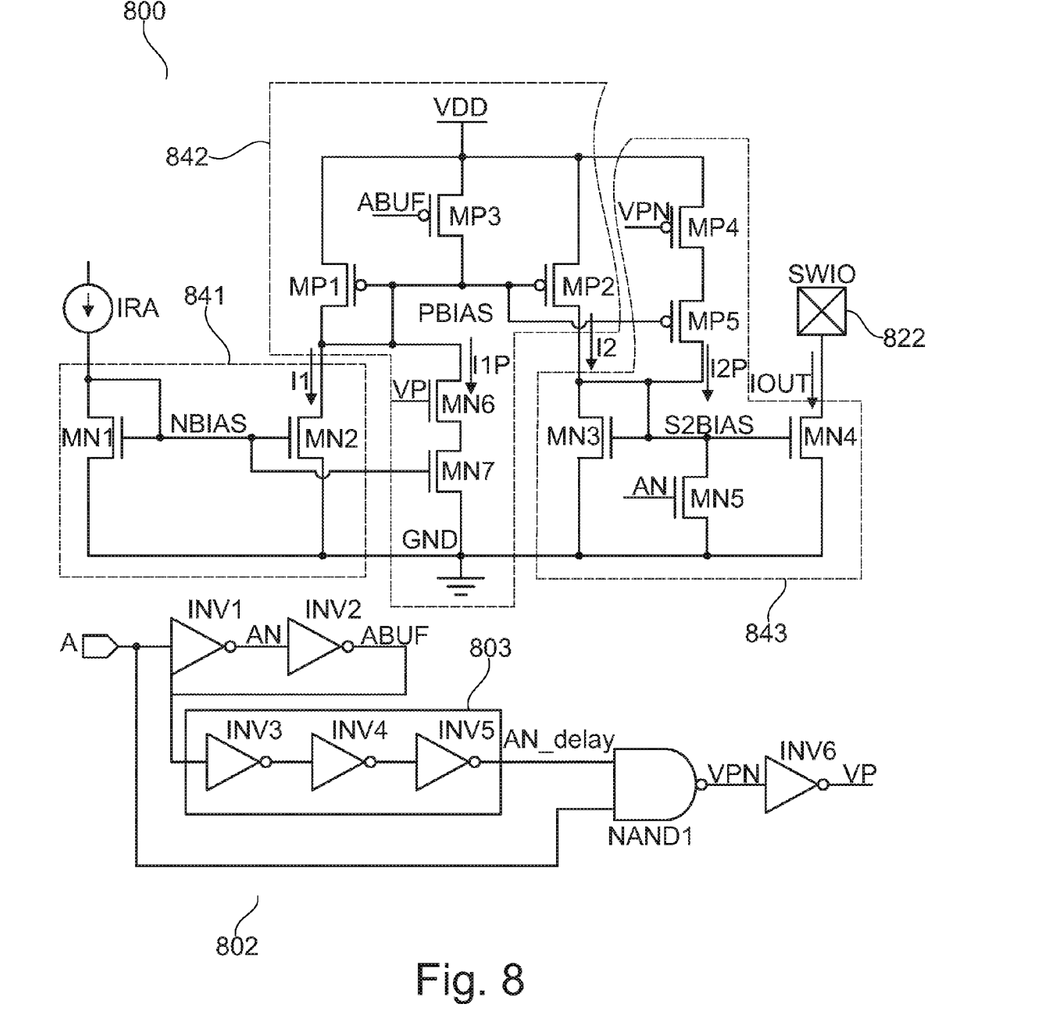
FIG. 8 shows a diagram of a SWP slave driver circuit in accordance with an embodiment of the present invention.

FIG. 8 shows a diagram of a SWP slave driver circuit in accordance with an embodiment of the present invention.

FIG. 8 shows another way of implementing the SWP slave driver 800 with dynamic boosting. In this implementation, NMOS MN7 and PMOS MP5 are added to the circuit shown in FIG. 6. MN7 is a current sink transistor which, like NMOS MN2, mirrors the current of NMOS MN1. MN6 is connected between drain of MN7 and PBIAS and its gate is controlled by pulse signal VP. MP5 is a current source which, like MP2, mirrors the current of MP1 and its drain is connected to S2BIAS. MP4 is connected between supply voltage VDD and source of PMOS MP5. The mirroring ratio between MN2 and MN7 can be set to 1:1 or higher multiplier based on the requirements. Similarly, the mirroring ratio between MP2 and MP5 can be set to 1:1 or higher multiplier based on the requirements. The main difference of the circuit 800 of FIG. 8 over the circuit of FIG. 6 is that the currents I1P and I2P are well defined and respectively controlled by the current sink MN7 and current source MP5.

Summarizing, the proposed invention provides driver circuits which reduce 'A' to 'SWIO' delay for better timing margins with minimum power dissipation. The proposed circuit senses the rising edge of input signal 'A' and produces a boost pulse. This boost pulse is used to provide additional amounts of current at PBIAS and S2BIAS, hence the transition of these signals to steady state becomes faster. Since the transition of bias voltages PBIAS and S2BIAS is faster, the transition of output current IOUT will be speeded up and thereby the 'A' to 'SWIO' delay is reduced. The proposed driver circuits of the present invention provide the following advantages:

(1) Boost pulses are generated along with input signal 'A' and thereby speed-up the transition of PBIAS and S2BIAS.

(2) The boost pulse is generated for a limited period of time. Hence, no additional static power consumption is caused.

(3) The width of the boost pulse is automatically controlled in such a way that the circuit provides uniform performance across various operating conditions (process corner, junction temperature and supply voltage). For example, in slow operating conditions, transition of PBIAS and S2BIAS is slower. Hence, a wider boost pulse is generated. Similarly, for fast operating conditions, transition of PBIAS and S2BIAS will be faster. Hence, the width of the boost pulse is shorter.

(4) Due to the boosting of the bias voltages, the propagation delay from 'A' to 'SWIO' is reduced. Thereby, the timing margin for the SWP protocol is improved.

It is noted that, unless otherwise indicated, the use of terms such as "upper", "lower", "left", and "right" refers solely to the orientation of the corresponding drawing.

It is noted that the term "comprising" does not exclude other elements or steps and that the use of the articles "a" or "an" does not exclude a plurality. Also elements described in association with different embodiments may be combined. It should also be noted that reference signs in the claims should not be construed as limiting the scope of the claims.

The invention claimed is:

1. A driver circuit for a single wire protocol slave unit, the driver circuit comprising:
    at least one current mirror comprising a first transistor and a second transistor, wherein the gate of both transistors is connected to a bias node, and wherein the second transistor is adapted to conduct a mirror current equal to a current conducted by the first transistor multiplied by a predetermined factor,
    a bias transistor for selectively connecting and disconnecting the bias node to and from a predetermined potential in response to a control signal,
    a current boosting element for providing a boost current to the bias node for a predetermined period of time when the control signal causes the bias transistor to disconnect the bias node from the predetermined potential,
    a further current mirror coupled in cascade with the current mirror, the further current mirror comprising a third transistor and a fourth transistor, wherein the gate of both transistors is connected to a further bias node, and wherein the fourth transistor is adapted to conduct a further mirror current equal to a current conducted by the third transistor multiplied by a further predetermined factor,
    a further bias transistor for selectively connecting and disconnecting the further bias node to and from a further predetermined potential in response to the control signal,
    a further current boosting element for providing a further boost current to the further bias node for the predetermined period of time when the control signal causes the further bias transistor to disconnect the further bias node from the further predetermined potential, and
    a yet further current mirror coupled in cascade with the current mirror and the further current mirror, the yet further current mirror comprising a fifth transistor and a sixth transistor, wherein the gate of the fifth transistor is connected to the gate of the sixth transistor, and wherein the sixth transistor is adapted to conduct a yet further mirror current equal to a reference current conducted by and provided to the fifth transistor multiplied by a yet further predetermined factor.

2. The driver circuit according to claim 1, further comprising a boost control circuit for generating a boost control signal based on the control signal.

3. The driver circuit according to claim 2, wherein the boost control circuit comprises a delay element adapted to provide a delay to the control signal, the delay corresponding to the predetermined period of time.

4. The driver circuit according to claim 2, wherein the current boosting element comprises a boost transistor connected to the bias node and adapted to conduct the boost current in response to the boost control signal.

5. The driver circuit according to claim 1, wherein the further current boosting element comprises a further boost transistor connected to the further bias node and adapted to conduct the further boost current in response to the boost control signal.

6. The driver circuit according to claim 1,
wherein the current boosting element comprises a first boost transistor and a second boost transistor, wherein the first and second boost transistors are connected in series between the bias node and the further predetermined potential, wherein the gate of the first boost transistor is coupled to receive the boost control signal, and wherein the gate of the second boost transistor is coupled to the interconnected gates of the fifth and sixth transistors of the yet further current mirror, and
wherein the further boosting element comprises a third boost transistor and a fourth boost transistor, wherein the third and fourth boost transistors are connected in series between the further bias node and the predetermined potential, wherein the gate of the third boost transistor is coupled to receive the boost control signal, and wherein the gate of the fourth boost transistor is coupled to the interconnected gates of the first and second transistors of the current mirror.

7. A universal integrated circuit card device comprising a driver circuit according to claim 1.

* * * * *